United States Patent [19]

Harms et al.

[11] 4,074,189

[45] Feb. 14, 1978

[54] CARRIER WITH CODE

[75] Inventors: Arie Anthonie Harms; Johan Gerrit Wark, both of Rijswijk, Netherlands

[73] Assignee: U.S. Philips Corporation, New York, N.Y.

[21] Appl. No.: 487,019

[22] Filed: July 10, 1974

Related U.S. Application Data

[60] Division of Ser. No. 315,304, Dec. 14, 1972, abandoned, which is a continuation of Ser. No. 128,091, March 25, 1971, abandoned.

[51] Int. Cl.$^2$ ............................................. G01R 15/12
[52] U.S. Cl. ............................ 324/73 R; 324/158 R; 235/304
[58] Field of Search ..................... 324/73 PC, 158 R; 235/153 AC

[56] References Cited

U.S. PATENT DOCUMENTS

| 3,058,061 | 10/1962 | Smith .................................... 324/73 |
| 3,585,500 | 6/1971 | Grubel ............................... 324/73 X |
| 3,622,876 | 11/1971 | Ure et al. ........................... 324/73 R |

Primary Examiner—Rudolph V. Rolinec
Assistant Examiner—Vincent J. Sunderdick
Attorney, Agent, or Firm—Frank R. Trifari; Daniel R. McGlynn

[57] ABSTRACT

An extensible coded carrier provided with a binary code, consisting of a number of binary code elements mounted, for example, on a printed-circuit board. The code is capable of being extended to include an element which is analogue in principle, for example, a resistor. If desired, the analogue code element may be converted into a digital code element with the aid of a discriminator. The extended code may be used as an address to address a treatment programme.

2 Claims, 3 Drawing Figures

CARRIER WITH CODE

This is a division, of application Ser. No. 315,304, filed Dec. 14, 1972 now abandoned which is a continuation of application Ser. No. 128,091, filed Mar. 25, 1971 now abandoned.

The invention relates to a carrier provided with a code consisting of a plurality of binary code elements, at least a plurality of which consists of galvanic contacts each of which is connected to one of two input terminals so as to form a binary code.

In a known embodiment such a code is used, for example, for characterizing a printed circuit board. Sometimes such a board is manufactured in various modifications after some time. In that case both gradual and discrete variations can be made in the components mounted on the board. In this case the binary code would have to be changed without the board itself being changed. In order to enable the use of the same panel with the same binary code, the carrier according to the invention is characterized in that for an extension of the code an electrical impedance is connected between at least one of the two input terminals and a further galvanic contact, the value of this impedance forming an anologue code element. In this case it is an advantageous mounting method that the element by which the construction modification is realized, is installed in the same process step as the addition impedance.

In subsequent process steps the purposes of the carrier may depend on the ultimate construction. A further embodiment according to the invention is therefore characterized in that the code, consisting of the binary code elements and the analogue code element, can be supplied to a treatment device, the code forming an address of the carrier by which a treatment programme can be addressed. In order to correct assembling errors another embodiment yet according to the invention is characterized in that the impedance consists of two sub-impedance, a redundancy being present in the address of the carrier owing to the values of both sub-impedances.

The treatment programme may show gradual or discrete variation. The former may be the case, for example, if an oscillator is constructed so as to operate at different frequencies. The treatment programme may then consists of, for example, the exact adjustment of the natural frequency of an oscillatory circuit to the oscillator frequency by readjustment of a trimmer. The coarse adjustment of the trimmer is determined by the code.

The construction of the board has a discrete variation if, for example, a ripple in an output voltage either is smoothed or is not smoothed. The treatment programme may then consist of, for example, the checking of the prevailing ripple. In the case that no smoothing takes place, the ripple, for example, is not checked either. In particular in the case of a discrete variation an embodiment according to the invention is characterized in that an analogue-to-digital converter converts the value of the impedance into a digital code, after which the extended digital code can address a treatment programme.

In many cases the carrier will be provided with an electrical circuit to be tested. A further embodiment according to the invention is therefore characterized in that the treatment device is a universal measuring apparatus performing a measuring programme.

In order that the invention may be readily carried into effect, one embodiment thereof will now be described in detail, by way of example, with reference to the accompanying diagrammatic drawing.

Figure 1:
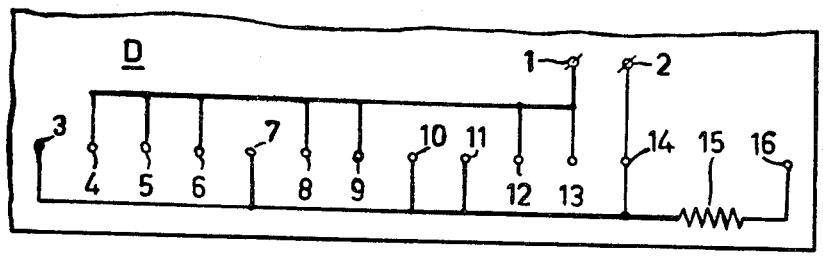
FIG. 1 shows a circuit of a code consisting of 12 electrical binary code elements, having a resistor as an extra code element.

In FIG. 1 two input terminals 1 and 2 are shown for a code on a carrier D. Twelve code contacts are numbered 3 to 14 and also shown are a resistor 15 and a contact 16. The contacts 3 to 14 being connected to either the first or to the second input terminal constitutes a binary code. If the first input terminal is identified by 1 and the second by 0 (zero), the binary number 011101100110 is formed. A further characteristic of this method of coding is that each of both input terminals has to be connected to at least one of the contacts 3 to 14. The value of the resistor 15 forms a detailing of the binary code according to the invention formed by the contacts 3 to 14. Contact 16 is connected to an input terminal of a measuring apparatus, for example, a ohmmeter. In that case terminal 2 is connected to the second input terminal of the ohmmeter. Instead of a single resistor, the analogue code element may, of course, contain a more complicated set-up, for example two resistors, the value of each of which is determined.

Figure 2:
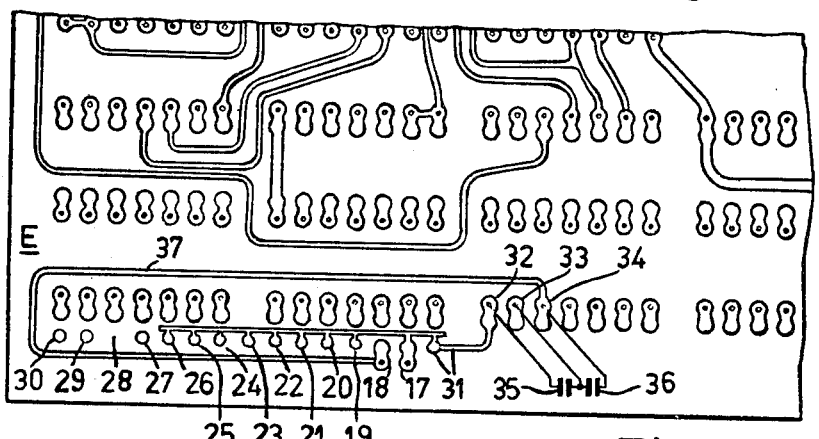
FIG. 2 shows an embodiment of a printed-circuit board having eight electrical binary code elements four optical binary code elements and two capacitors as analogue code elements, which also produce a redundancy in the address of the carrier.

FIG. 2 shows a portion of a printed-circuit board E. The board is provided with rows of contacts which are always arranged in groups of seven. A contact consists of a larger circular portion and a smaller circular portion connected to each other. In the larger circular portion a hole is present in which contact pins of circuit elements may be inserted during mounting. The smaller circular portions form contact surfaces on which electrical connections can be made by means of sensing pins. The code consists of two contacts 17 and 18 acting as input terminals, eight binary code elements 19 to 26 which are each time connected to 17 or 18, and four further binary code elements 27 to 30 formed by the presence or absence of a hole in the board. The presence of a hole can be detected in a known manner with the aid of a light source and a photocell. Both kinds of binary code elements have advantages. Electrical ones require a simple measuring device, whilst optical ones operate also at a distance. The extension of the code according to the invention consists of three contacts 32, 33 and 34, two capacitors 35 and 36, an additional contact with conductor 31 and a by-pass 37. Contact 32 is therefore connected to 17 and contact 34 is connected to 18. The capacitors are connected between the further contacts 32 and 33 and between 33 and 34, respectively. The values of the capacitors can be determined by sensing pins on the contacts 32, 33 and 34, for example, in an alternating current bridge of a known type. As two capacitors are present, a mounting error with respect to only one capacitor can be detected immediately: the address formed by the code has redundancy.

A simple embodiment can yet be achieved by omitting the contacts 32 and 34 and by connecting the capacitors between the contacts 17 and 33 and 18 and 33, respectively. In that case the conductor 37 is also omitted. In stead of the capacitors 35 and 36, for example, resistors, inductances or zener diodes may also be used.

Figure 3:
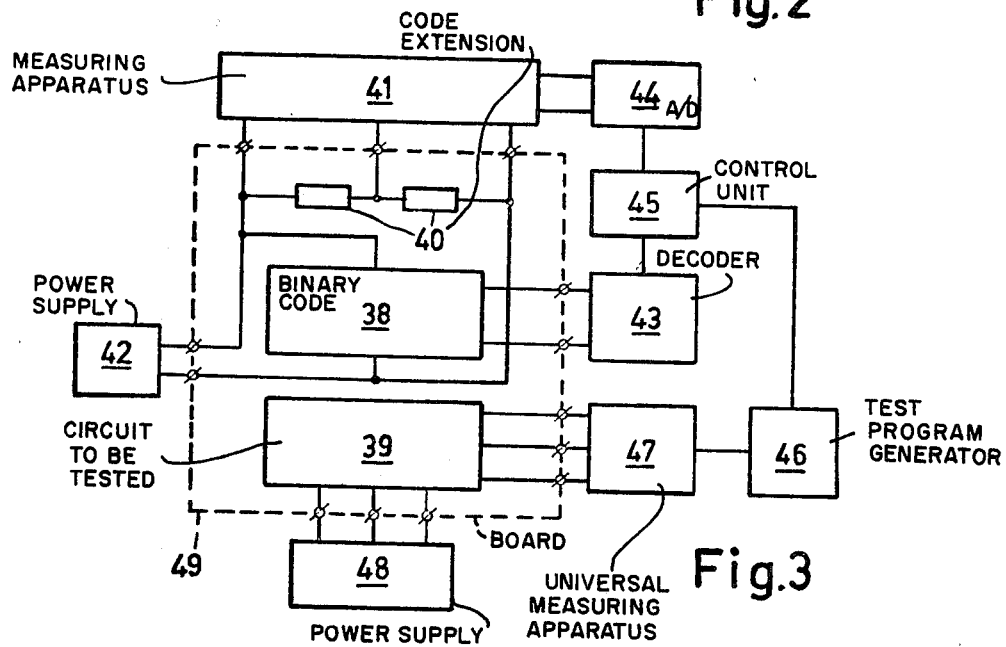
FIG. 3 shows a block diagram of a measuring set-up for the automatic testing of printed-circuit boards according to the invention.

In FIG. 3 a block diagram is shown of a set-up for the automatic testing of printed-circuit boards. The set-up may comprise a board 49 with a binary code 38 thereon, a circuit 39 to be tested, and a code extension 40 according to the invention. Furthermore are present a power-supply 42, a decoder 43, a measuring apparatus 41 for measuring the impedances of the two analogue code elements 40, an analogue-to-digital converter 44, a control unit 45, a test-programme generator 46 and a universal measuring apparatus 47. Furthermore, a power-supply 48 is provided for the circuit 39.

The coding circuit 38 + 40 is fed by the power-supply 42. The value of the analogue code elements is measured in the measuring apparatus 41. The latter may comprise, for example, a known measuring bridge which is fed by the power-supply 42. The values of the impedances 40 are supplied to the analogue-to-digital converter 44. The code is therefore recognized in 41 and 43. The signals of 43 and 44 are supplied to the control unit 45 and are combined to form an address for the test-programme generator 46 so that a test programme is addressed. The circuit 39 is fed by the power-supply 48, which may be the same power-supply as 42. Next, the test programme addressed in the test programme generator 46 is executed with the universal measuring apparatus 47. The advantage of this test method is that boards of different types can be measured unassorted. Consequently, a higher processing speed is realized.

What is claimed is:

1. In a system for the treatment of electronic devices or elements wherein a particular treatment program is selectable upon the occurrence of a particular coded address, said system including at least one carrier of the type such as a printed circuit board, the improvement comprising:

a pair of input terminals located on said carrier; a plurality of galvanic contacts being disposed on said carrier; means for connecting a first of said terminals to a predetermined number of said galvanic contacts; means for connecting the second terminal to a predetermined number of galvanic contacts which are not connected to said first terminal, each of said terminals being identified with a digital logical value, one of said terminals being associated with a logical "1" and the other terminal being associated with a logical "0", said arrangement of galvanic contacts being ordered in accordance with a predetermined pattern so that a predetermined digital coded number corresponds to said ordered arrangement of galvanic contacts; a further galvanic contact being disposed on said carrier;

an electrical impedance element being connected between said further galvanic contact and one of said input terminals, said impedance element forming an analog code element for extending said binary coded arrangement of galvanic contacts, sensing means responsive to said digital coded arrangement of galvanic contacts and said analog code element for providing an address for selecting a corresponding treatment program of said treatment system.

2. The system of claim 1, wherein said treatment system is a universal measuring apparatus, said program is a predetermined measuring program and the system includes an analog-to-digital converter for converting the analog value of the impedance to a digital coded value, the combined coded number of said galvanic arrangement and converted impedance value providing an extended digital coded value for addressing said program.

* * * * *

UNITED STATES PATENT AND TRADEMARK OFFICE
CERTIFICATE OF CORRECTION

PATENT NO. : 4,074,189
DATED : February 14, 1978
INVENTOR(S) : ARIE A. HARMS ET AL It is certified that error appears in the above-identified patent and that said Letters Patent are hereby corrected as shown below:

On the Title Page, after Section [22], insert the following:

--[30]    Foreign Application Priority Data
    April 15, 1970    Netherlands.........7005372--

Signed and Sealed this

Sixth Day of June 1978

[SEAL]

Attest:

RUTH C. MASON
Attesting Officer

DONALD W. BANNER
Commissioner of Patents and Trademarks